(12) United States Patent
Lim (10) Patent No.: US 10,454,460 B2
(45) Date of Patent: Oct. 22, 2019

(54) ROBUST TRIMMING SCHEME FOR LOW POWER RC OSCILLATOR COMPATIBLE WITH HIGH TEMPERATURE OPERATION

(71) Applicant: Infineon Technologies AG, Neubiberg (DE)

(72) Inventor: Chern Sia Phillip Lim, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 15/422,805

(22) Filed: Feb. 2, 2017

(65) Prior Publication Data

US 2018/0219535 A1 Aug. 2, 2018

(51) Int. Cl.
*H03K 4/501* (2006.01)
*H03B 5/24* (2006.01)
*H03B 5/26* (2006.01)

(52) U.S. Cl.
CPC .............. *H03K 4/501* (2013.01); *H03B 5/24* (2013.01); *H03B 5/26* (2013.01); *H03B 2200/005* (2013.01); *H03B 2201/0208* (2013.01)

(58) Field of Classification Search
CPC ...... H03B 5/24; H03B 5/26; H03B 2200/005; H03B 2201/0208; H03K 4/501
USPC ...... 331/111, 143, 135, 158, 117 FE, 116 FE
See application file for complete search history.

(56) References Cited

U.S. PATENT DOCUMENTS

2007/0241833 A1* 10/2007 Nervegna .............. H03K 3/011
                                                                331/176
2018/0091096 A1* 3/2018 Wu .......................... H03B 5/24

FOREIGN PATENT DOCUMENTS

WO 2007/125366 A2 11/2007

* cited by examiner

*Primary Examiner* — Arnold M Kinkead
(74) *Attorney, Agent, or Firm* — Eschweiler & Patshnik, LLC (57) ABSTRACT

In some embodiments, the present disclosure relates to a frequency generator having a resistor network and a capacitor network. The capacitor network has a plurality of capacitors connected in parallel with one another. A comparator is configured to output an oscillating voltage signal. An input of the comparator is connected to the output of the resistor network and the output of the capacitor network. A frequency testing circuit is configured to calculate a frequency of the oscillating voltage signal and determine whether the frequency is within a range of an expected frequency. The frequency testing circuit may also be configured to selectively connect a first plate of the plurality of capacitors to a non-varying voltage or to the input of the capacitor network to adjust a frequency of the oscillating voltage signal.

20 Claims, 4 Drawing Sheets

| | Thermometric Coarse Decoding | | | | Capacitors Group 1 (420) (pF) | Capacitor Group 2 (422) (pF) | Capacitance ratio between Capacitor Group 1 & 2 (α) |
|---|---|---|---|---|---|---|---|
| Coarse Code | | Coarse Tuning Signals (Coarse Trim) | | | | | |
| <1> | <0> | $S_{coarse,k}$ (<3>) | $S_{coarse,2}$ (<2>) | $S_{coarse,1}$ (<1>) | | | |
| 0 | 0 | 1 | 1 | 1 | 17.36 | 0.00 | 1.0000 |
| 0 | 1 | 1 | 1 | 0 | 14.66 | 2.70 | 0.8445 |
| 1 | 0 | 1 | 0 | 0 | 12.66 | 4.70 | 0.7293 |
| 1 | 1 | 0 | 0 | 0 | 11.16 | 6.20 | 0.6429 |

502 – row with 0,0,1,1,1
504 – row with 0,1,1,1,0
506 – row with 1,0,1,0,0
508 – row with 1,1,0,0,0

| | Thermometric Fine Decoding | | | | Effective Resistance R (kΩ) |
|---|---|---|---|---|---|
| Fine Code | | Fine Tuning Signals (Fine Trim) | | | |
| <1> | <0> | $S_{fine,k}$ (<3>) | $S_{fine,2}$ (<2>) | $S_{fine,1}$ (<1>) | |
| 0 | 0 | 0 | 0 | 0 | 1000 |
| 0 | 1 | 0 | 0 | 1 | 960 |
| 1 | 0 | 0 | 1 | 1 | 920 |
| 1 | 1 | 1 | 1 | 1 | 880 |

602 – first data row
604 – second
606 – third
608 – fourth

| System Frequency Tuning | | | | Frequency Computation | | | |
|---|---|---|---|---|---|---|---|
| Coarse Code | | Fine Code | | Capacitance ratio between Capacitor Group 1 & 2 (α) | Effective Resistance R (kΩ) | System Signal Frequency (kHz) | System Signal Frequency (% deviation with respect to 32.768kHz) |
| <2> | <1> | <2> | <1> | | | | |
| 0 | 0 | 0 | 0 | 1.0000 | 1000 | 26.21 | -20.0% |
| | | 0 | 1 | | 960 | 27.31 | -16.7% |
| | | 1 | 0 | | 920 | 28.49 | -13.0% |
| | | 1 | 1 | | 880 | 29.79 | -9.1% |
| 0 | 1 | 0 | 0 | 0.8445 | 1000 | 29.12 | -11.1% |
| | | 0 | 1 | | 960 | 30.33 | -7.4% |
| | | 1 | 0 | | 920 | 31.65 | -3.4% |
| | | 1 | 1 | | 880 | 33.09 | 1.0% |
| 1 | 0 | 0 | 0 | 0.7293 | 1000 | 32.01 | -2.3% |
| | | 0 | 1 | | 960 | 33.35 | 1.8% |
| | | 1 | 0 | | 920 | 34.80 | 6.2% |
| | | 1 | 1 | | 880 | 36.38 | 11.0% |
| 1 | 1 | 0 | 0 | 0.6429 | 1000 | 34.84 | 6.3% |
| | | 0 | 1 | | 960 | 36.29 | 10.7% |
| | | 1 | 0 | | 920 | 37.87 | 15.6% |
| | | 1 | 1 | | 880 | 39.59 | 20.8% |

ROBUST TRIMMING SCHEME FOR LOW POWER RC OSCILLATOR COMPATIBLE WITH HIGH TEMPERATURE OPERATION

FIELD

The present disclosure relates to systems and methods for trimming an RC relaxation oscillator by varying a capacitor ratio to modulate the frequency.

BACKGROUND

Oscillators are designed to generate a signal that periodically changes over time. One type of oscillator is a relaxation oscillator. A relaxation oscillator is a repeating circuit that achieves a repetitive output signal by charging and discharging a capacitor through a resistor. The time that it takes to charge and discharge the capacitor defines a period of the output signal of the relaxation oscillator.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following detailed description makes reference to the accompanying drawings which constitute a part of the disclosure and in which, for purposes of illustration, special example embodiments are shown, whereby the disclosure can be practically realized. It is understood that other example embodiments may be employed, and that structural and other changes may be implemented, without going beyond the scope of protection of the present disclosure. Thus, the following detailed description should not be regarded as being limitative. Rather, the scope of protection of the present disclosure is defined only by the accompanying patent claims.

Depending on an application of an oscillator, a user may operate the oscillator to generate the oscillating signal at a specific frequency over a wide range of temperatures. Therefore, manufacturers attempt to design oscillators that consistently generate a specific frequency over this wide range of temperatures. However, process variations in the manufacturing of the oscillator can account for up to a +/−30% variation in the desired frequency. Accordingly, manufacturers may employ a trimming technique to overcome these process variations and achieve a frequency close to the desired frequency.

In certain oscillators, such as RC relaxation oscillators, this trimming technique involves manufacturers incorporating additional circuits to vary the effective resistance/capacitance in a RC reference network circuit comprising resistors and capacitors. Trimming switches are typically used to connect (or disconnect) resistors and/or capacitors to manipulate the RC delay constant of the oscillator. Because the RC delay constant dictates the frequency of the oscillating signal, the manufacturer is able to account for the processing variations that may exist from manufacturing the oscillator.

However, for certain low-power applications, such as a 32.768 kHz oscillator used in real-time clock applications, this trimming technique has a number of disadvantages that results in frequency variation of the oscillator across temperatures. For example, high drain/source and gate oxide leakages from these trimming switches, which are prevalent at high temperatures and/or fast process corners, can result in frequency deviations across temperatures. In addition, these switches often have process dependent leakages that compromise the stability of the trimming procedure of the oscillator.

The present disclosure relates to a method and apparatus for trimming a RC relaxation oscillator by varying a capacitor ratio to modulate a frequency of the oscillator. By varying a capacitor ratio to adjust the frequency of the oscillator, the impact of leakages associated with trimming switches used to connect additional capacitors can be drastically reduced.

Figure 1:
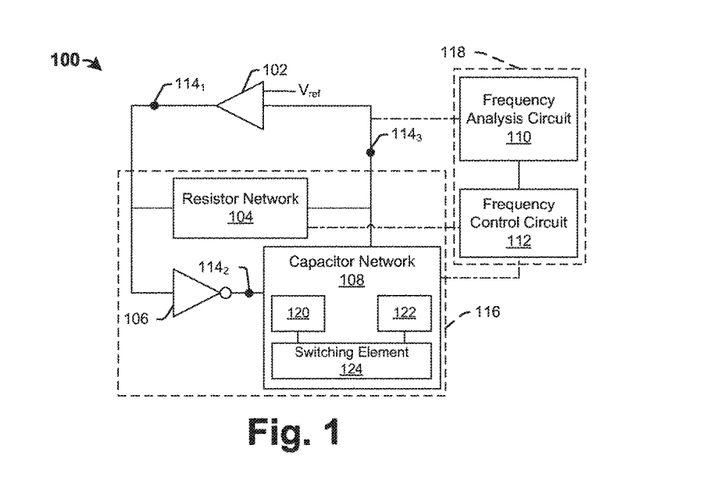
FIG. 1 illustrates a block diagram of some embodiments of an electronic oscillator that may be selectively tuned by a frequency testing circuit.

FIG. 1 is a block diagram 100 of some embodiments of an electronic oscillator that may be selectively tuned by a frequency testing circuit. As illustrated, a comparator 102 (e.g., an inverting comparator) is configured to output a signal having an oscillating voltage. In some embodiments, the comparator may be a logic inverter. The comparator 102 comprises an input, an output, and a tripping threshold defined by a reference voltage $V_{ref}$. The comparator will output a signal depending on the input signal voltage level compared to the reference voltage $V_{ref}$. In some embodiments, the output signal of the comparator 102 is an oscillating square wave.

The output of the comparator 102 is coupled to an input of a RC network circuit 116. The RC network circuit 116 may comprise a resistor network 104 and a capacitor network 108. The frequency of the oscillating signal output from the comparator 102 is based on an RC delay constant of the RC network circuit 116, which is determined by the effective resistance and effective capacitance of the resistor network 104 and the capacitor network 108 respectively. For example, a large RC delay constant will correspond to an oscillating signal having a lower frequency than a small RC delay constant. With the output of the comparator 102 being connected to the input of the RC network circuit 116, the comparator 102 will continually generate an oscillating signal since the comparator 102 will attempt to match the voltage being output by the RC network 116 to the reference voltage $V_{ref}$, which changes as the capacitor network 108 charges and discharges.

The resistor network 104 may comprise a plurality of resistors. In some embodiments, the resistor network may comprise a variable resistor. The input of the resistor network 104 is coupled to the output of the comparator 102. In some embodiments, the plurality of resistors are connected in series to give a fixed resistance. In some embodiments, each individual resistor in the resistor network 104 may be connected in parallel with a respective resistor switch. The respective resistor switches are configured to toggle between states to vary the effective resistance of the resistor network 104. In some embodiments, the resistor switches are not configured to toggle between states, and instead, are configured to be fixed in a state.

The output of the comparator 102 is also coupled to an input of the inverter 106. In some embodiments, the inverter 106 may be a logic inverter, for example, a NOT gate.

The output of the inverter 106 is coupled to an input of the capacitor network 108. The capacitor network 108 comprises a plurality of capacitors. In some embodiments, the plurality of capacitors are connected in parallel. Each individual capacitor in the capacitor network 108 may be connected in series to a respective switching element 124, for example, a logic gate. The switching elements 124 are configured to toggle between states to vary a capacitance ratio between a first group of capacitors 120 in the capacitor network 108 connected to the output of the inverter 106 and a second group of capacitors 122 in the capacitor network 108 connected to ground. By varying a capacitance ratio between the first group of capacitors 120 and the second group of capacitors 122, the effective capacitance of the capacitor network 108 can be changed.

For example, each of the respective switching elements 124 are connected to a first plate of each individual capacitor. In some embodiments, each of the respective switching elements 124 may toggle a connection between ground and the output signal of the inverter 106. Therefore, the capacitor network 108 may comprise a first group of capacitors 120, which has their first plate connected to the output of the inverter 106, and a second group of capacitors 122, which has their first plate connected to ground. In some embodiments, the first group of capacitors may instead have their first plate connected to any non-varying voltage (e.g. a stable supply voltage or a reference voltage). Based on the state of each individual switching element 124, the first group of capacitors 120 will have a first capacitance and the second group of capacitors 122 will have a second capacitance. Thus, by toggling the switching elements 124 between states, the switching elements may selectively vary the capacitance ratio between capacitors with their first plate connected to ground and capacitors with their first plate connected to an output of the inverter 106.

A frequency testing device 118 is connected to the electronic oscillator and is configured to determine a first frequency and determine whether the first frequency is within a range of the expected frequency. In some embodiments, the frequency testing device 118 may comprise a frequency analysis circuit 110 and a frequency control circuit 112. The frequency analysis circuit 118 is configured to analyze a signal being generated by the electronic oscillator, determine the first frequency, and determine if the first frequency is within a range of an expected frequency, for example, 32.768 kHz+/−5%. When the frequency analysis circuit 110 determines the first frequency is not within the range of the expected frequency, the frequency control circuit 112, which may be connected to the resistor network 104 and/or the capacitor network 108, selectively toggles switching elements disposed in the capacitor network 108 to selectively vary the capacitance ratio between the first group of capacitors 120 and the second group of capacitors 122. By selectively varying the capacitance ratio between the first group of capacitors 120 and the second group of capacitors 122, the frequency testing device 118 is able to manipulate the RC delay constant of the electronic oscillator. In some embodiments, the frequency control circuit 112 may also selectively toggle resistor switches (not shown) disposed in the resistor network 104 to vary the effective resistance of the resistor network 104, which allows further control over the RC delay constant of the electronic oscillator.

After the frequency control circuit 112 varies the effective resistance of the resistor network 104 and the capacitance ratio between the first group of capacitors 120 and the second group of capacitors 122, the frequency analysis 118 circuit may determine a second frequency and determine if the second frequency is within the range of the expected frequency. If the second frequency is not within the range of the expected frequency, the frequency control circuit 112 will again selectively vary the effective resistance or the capacitance ratio of the electronic oscillator. If the second frequency is within the range of the expected frequency, the frequency control circuit 112 will take appropriate steps to fix the states of the respective resistor switches and/or respective switching elements.

Figure 2:
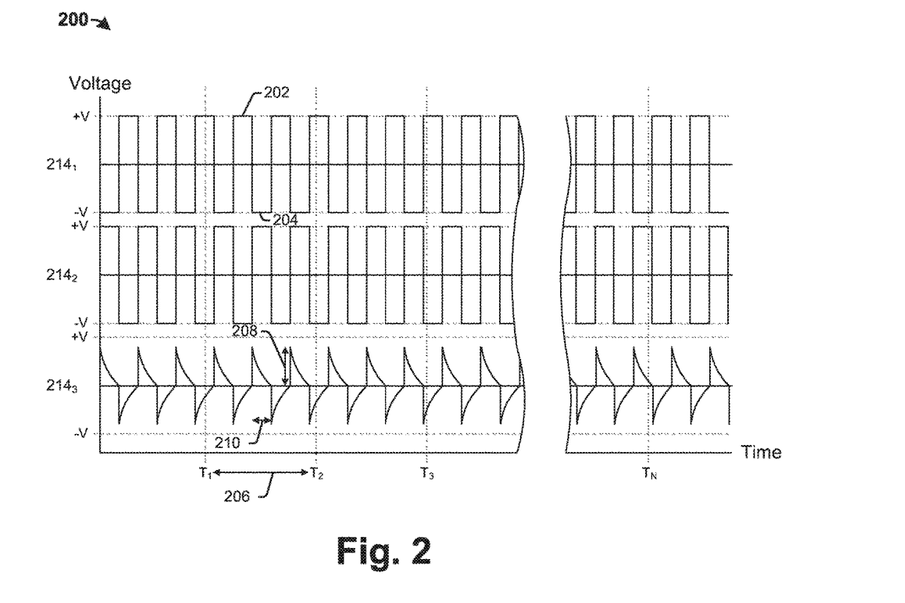
FIG. 2 illustrates some embodiments of a waveform graph (voltage vs. time) for select nodes of the electronic oscillator of FIG. 1 before the electronic oscillator has been selectively tuned.

FIG. 2 illustrates some embodiments of a waveform graph 200 (voltage vs. time) for select nodes of the electronic oscillator of FIG. 1 before the electronic oscillator has been selectively tuned. FIG. 2 comprises 3 separate waveform graphs $214_1$, $214_2$, $214_3$ that illustrate a signal at 3 separate nodes $114_1$, $114_2$, $114_3$ of the electronic oscillator in FIG. 1. The first waveform graph $214_1$ corresponds to a first node $114_1$ of FIG. 1. As depicted in the first waveform graph $214_1$, in some embodiments, the comparator 102 provides an oscillating square wave signal to the first node $114_1$ over some period of time 206. The square waveform oscillates between a high voltage 202 and a low voltage 204. The high voltage 202 may correspond to the supply voltage of the comparator 102, for example, 700 mV. In some embodiments, the low voltage 204 may correspond to ground. In other embodiments, the low voltage 204 may correspond to a negative supply voltage.

The second waveform graph $214_2$ corresponds to the second node $114_2$ of FIG. 1. As depicted, the second waveform graph $214_2$ is an inverted signal of the oscillating square wave signal depicted in the first waveform graph $214_1$.

The third waveform graph $214_3$ corresponds to the third node $114_3$ of FIG. 1. The third node $114_3$ connects the output of the resistor network 104 and the output of the capacitor network 108 to the input of the comparator 102. The third waveform graph $214_3$ illustrates a waveform depicting the charging and discharging of the capacitors disposed in the capacitor network 108 and the signal being output by the resistor network 104, based on the waveforms depicted in the first waveform graph $214_1$ and the second waveform graph $214_2$. For example, when the first waveform graph $214_1$ is at a low voltage 204 (i.e., the output of the comparator 102 is negative), current flows from the RC network circuit 116 to the output of the comparator 102, discharging of the capacitor network 108 and decreasing the voltage at the third node 114₃. The voltage decreases until it is less than the reference voltage $V_{ref}$, at which time the waveform depicted in the first waveform graph 214₁ becomes a high voltage 202 (i.e., the output of the comparator 102 becomes positive) and current flows from the comparator 102 to the RC network circuit 116, charging the capacitor network 108.

The waveform in the third waveform graph 214₃ comprises a first voltage step 208 and a first period dependent 210. Both the first voltage step 208 and the first period dependent 210 are dependent on the capacitance ratio between the first group of capacitors 120 and the second group of capacitors 122. The first voltage step 208 is dependent of the conservation of charges in capacitors and can be calculated by the following equations:

Voltage Step 208 = $\alpha$ * (high voltage 202 - low voltage 204)     (eqn. 1.1)

$$\alpha = \frac{C_A}{C_A + C_B}$$     (eqn. 1.2)

$C_A$ refers to a capacitance of the first group of capacitors 120, which have their first plate connected to the output of the inverter 106. $C_B$ refers to a capacitance of the second group of capacitors 122, which have their first plate connected to ground.

The time duration of the first period dependent 210 is dependent on the RC delay constant of the RC network circuit 116. Therefore, in addition to the capacitance ratio between the first group of capacitors 120 and the second group of capacitors 122, the first period dependent 210 is also dependent on the effective resistance of the resistor network 104. The first period dependent 210 may be calculated by the following equation:

Periodic Dependent210=$R*C*\ln(1+2\alpha)$     (eqn. 1.3)

R refers to the effective resistance of the resistor network 104. C refers to the effective capacitance of the capacitor network 108, which is the sum of capacitances given by the first group of capacitors 120 and the second group of capacitors 122. Alpha ($\alpha$) refers to the capacitance ratio between the first group of capacitors 120 and second group of capacitors 122, which is defined above (eqn. 1.2).

All 3 waveform graphs 214₁, 214₂, 214₃ oscillate at the same frequency. The frequency of the oscillating signals depends on the capacitance ratio between the first group of capacitors 120 and the second group of capacitors 122. The frequency of the oscillating signals also depends on the effective resistance and the effective capacitance of the resistor network 104 and the capacitor network 108. The frequency of the oscillating signals may be calculated by the following equation:

$$\text{frequency} = \frac{1}{2*R*C*\ln(1+2\alpha)}$$     (eqn. 1.4)

Because the frequency of the oscillating signals depends on the RC delay constant and the capacitance ratio between the first group of capacitors 120 and the second group of capacitors 122, selectively manipulating the RC delay constant and/or the effective resistance of the electronic oscillator allows the frequency of the electronic oscillator to be trimmed, for example, increasing or decreasing the frequency of the electronic oscillator.

Figure 3:
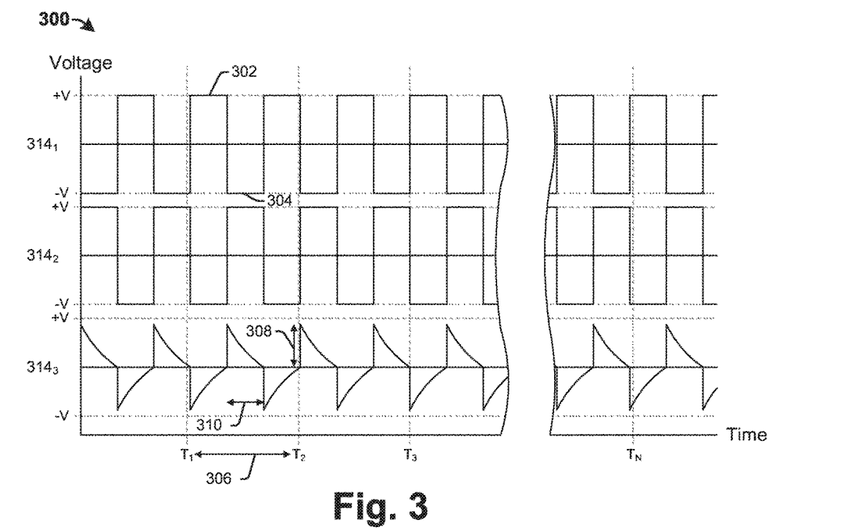
FIG. 3 illustrates some embodiments of a waveform graph (voltage vs. time) for select nodes of the electronic oscillator of FIG. 1 after the electronic oscillator has been selectively tuned.

FIG. 3 illustrates some embodiments of a waveform graph 300 (voltage vs. time) for select nodes of the electronic oscillator of FIG. 1 after the electronic oscillator has been selectively tuned. After the electronic oscillator has been selectively tuned, the high voltage 302 and the low voltage 304 remain constant. However, a second voltage step 308 and a second period dependent 310 may be altered depending on whether the selective tuning increased or decreased the frequency being generated by the electronic oscillator. For example, the second voltage step 308 may be greater than or less than the first voltage step 208 of waveform graph 200 and/or the second period dependent 310 may be greater than or less than the first voltage step 210 of waveform graph 200.

In some embodiments, such as that depicted in FIG. 3, it is desirable to decrease the frequency being generated by the electronic oscillator (i.e. to decrease a frequency of the first waveform graph 314₁ relative to the first waveform graph 214₁ of graph 200). This may be achieved by increasing the number of capacitors in the capacitor network 108 that have their first plate connected to the output of the inverter 106, which increases the number of capacitors in the first group of capacitors 120. By increasing the number of capacitors in the first group of capacitors 120, $\alpha$ (eqn. 1.2) will increase. Increasing $\alpha$ increases the second voltage step 308. Increasing the second voltage step 308 increases the second period dependent 310, which decreases the frequency being generated by the electronic oscillator. In some embodiments, the effective resistance of the resistor network 104 is also increased to decrease the frequency being generated by the electronic oscillator.

Figure 4:
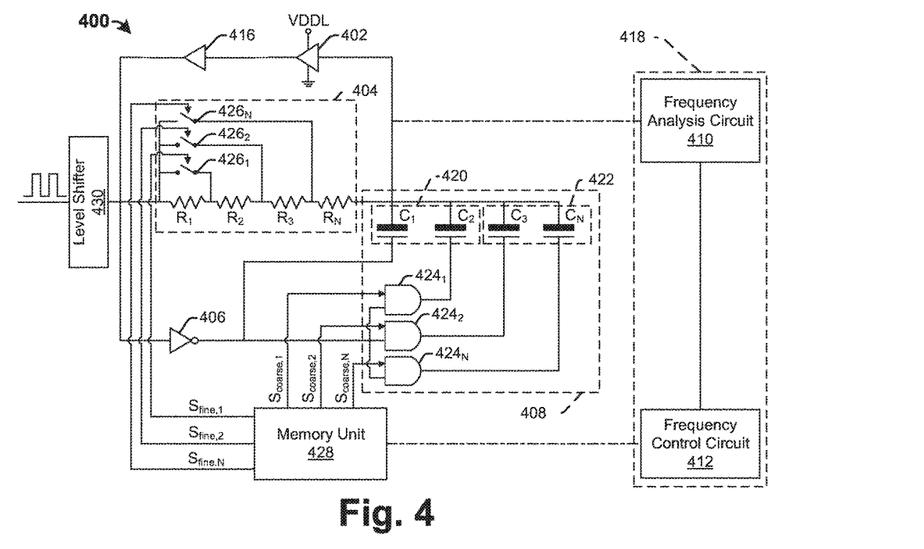
FIG. 4 illustrates a block diagram of some more detailed embodiments of an electronic oscillator that may be selectively tuned by a frequency testing circuit.

FIG. 4 is a block diagram 400 of some more detailed embodiments of an electronic oscillator that may be selectively tuned by a frequency testing circuit. As illustrated, a comparator 402 (e.g., implemented as an inverter) comprises an output, an input, and 2 supply voltage inputs VDDL and ground. In some embodiments, the inverter 402 is matched to other components in a larger system, for example, a pre-regulator. For example, the pre-regulator may provide VDDL to the electronic oscillator. To match the comparator 402 to components of the pre-regulator, the process parameters of the 2 circuits may track one another, for example, sizing the circuits in such a way to maintain the ratio of process parameters between the 2 circuits or placing the matched components closely together to minimize localized process gradients. In some embodiments, the comparator 402 generates a square wave oscillating signal. In further embodiments, the comparator 402 provides the square wave oscillating signal to a logic buffer 416.

The output of the logic buffer 416 may be connected to the input of a resistor network 404, a level shifter 430, and an inverter 406. The inverter 406 is configured to receive the signal generated by the comparator 402, invert that signal, and provide the inverted signal to a capacitor network 408. The level shifter 430 is configured to receive the signal generated by the comparator 402, shift the voltage, and output the voltage shifted signal. For example, the electronic oscillator may generate a signal in a voltage domain that is incompatible with the voltage domain of another part of the system. Therefore, the level shifter 430 is configured to shift the voltage of the signal to the appropriate voltage domain without altering the waveform of the signal.

The resistor network 404 may comprise a variable resistor that is configured to vary the effective resistance of the resistor network based on an input signal. In some embodiments, the resistor network 404 may comprises a plurality of resistors $R_1, R_2, R_3, R_N$ connected in series with one another.

Some resistors of the plurality of resistors $R_1$, $R_2$, $R_3$, $R_N$ may have a respective resistor switch $426_1$, $426_2$, $426_N$ connected in parallel with a respective resistor $R_1$, $R_2$, $R_3$, $R_N$. The resistor switches $426_1$, $426_2$, $426_N$ are configured to toggle between states to increase/decrease the effective resistance of the resistor network 404. For example, in some embodiments, a first resistor $R_1$ is connected in series with N number of resistors. A respective resistor switch $426_1$ is connected in parallel with the first resistor $R_1$. The resistor switch $426_1$ may be set to a first state (e.g. closed), which bypasses the first resistor $R_1$, to reduce the effective resistance of the resistor network 404, or the resistor switch $426_1$ may be set to a second state (e.g. open), which allows current to flow through the first resistor $R_1$, to increase the effective resistance of the resistor network 404. The output of the resistor network 404 is connected to the input of the comparator 402 and the output of the capacitor network 408.

The capacitor network 408 may comprise a plurality of capacitors $C_1$, $C_2$, $C_3$, $C_N$ connected in parallel with one another. In some embodiments, respective logic gates $424_1$, $424_2$, $424_N$ may be connected to N−1 capacitors (e.g. $C_2$, $C_3$, $C_N$). In some other embodiments, each individual capacitor $C_1$, $C_2$, $C_3$, $C_N$ is connected to a respective logic gate. Each individual logic gate $424_1$, $424_2$, $424_N$ comprises a first input connected to the output of the inverter 406 and a second input connected to a memory unit 428.

The respective logic gates are configured to toggle between a first state, which defines a capacitor as being in the first capacitor group 420, and a second state, which defines a capacitor as being in the second capacitor group 422. The first state connects the first plate of some capacitors (e.g. $C_1$ and $C_2$) to the output of the inverter 406. The second state connects the first plate of some capacitors (e.g. $C_3$ and $C_N$) to ground. For example, if the memory unit 424 provides a signal having a first value to a logic gate, it will drive the output of the logic gate to have a value equal to an output of the inverter 406. Alternatively, if the memory unit 424 provides a signal having a second value to the logic gate, it will drive the output of the logic gate to have a value of zero. Based on the state of each logic gate $424_1$, $424_2$, $424_N$ the first capacitor group 420 will have a first capacitance and the second capacitor group 422 will have a second capacitance. Thus, by selectively toggling the logic gates $424_1$, $424_2$, $424_N$ between states, the logic gates $424_1$, $424_2$, $424_N$ may vary the capacitance ratio between capacitors with their first plate connected to ground and capacitors with their first plate connected to an output of the inverter 406. The output of the capacitor network 408 is connected to the output of the resistor network 404 and the input of the comparator 402. The memory unit 428 may selectively provide a signal to some logic gates $424_1$, $424_2$, and/or $424_N$ to vary the number of capacitors in the first group of capacitors 420 or second group of capacitors 422.

The memory unit 428 (e.g. read only memory) is connected to the second input of each logic gate $424_1$, $424_2$, $424_N$. The memory unit 428 is configured to selectively provide separate signals $S_{coarse,1}$, $S_{coarse,2}$, $S_{coarse,N}$ to each individual logic gate $424_1$, $424_2$, $424_N$. The memory unit is also configured to provide separate signals $S_{fine,1}$, $S_{fine,2}$, $S_{fine,N}$ to each individual resistor switch $426_1$, $426_2$, $426_N$. In some embodiments, the memory unit 428 may provide a first signal to each of the second group of capacitors 422. In other embodiments, the memory unit 428 may provide signals to the first group of capacitors 420. In further embodiments, the memory unit 428 may provide a first set of signals to the resistor network 404 and/or the capacitor network 408 for a first period of time, and then provide a second set of signals, which is different from the first set of signals, to the resistor network 404 and/or the capacitor network 408 for a second period of time.

For example, the frequency testing device 418 is connected to the electronic oscillator and is configured to calculate a first frequency and determine whether the first frequency is within a range of the expected frequency. The frequency testing device 418 may comprise a frequency analysis circuit 410 that is configured to analyze a signal being generated by the electronic oscillator, determine a first frequency, and determine if the first frequency is within a range of an expected frequency, for example, 32.768 kHz+/− 5%. When the frequency analysis circuit 410 determines the first frequency is not within the range of the expected frequency, the frequency control circuit 412 may provide a first series of instructions to the memory unit 428. Based on the first series of instructions, the memory unit 428 selectively provides individual signals $S_{coarse,1}$, $S_{coarse,2}$, $S_{coarse,N}$ to selectively toggle the state of each logic gates $424_1$, $424_2$, $424_N$. By selectively varying the capacitance ratio between the first group of capacitors 420 and the second group of capacitors 422, the frequency testing device 418 is able to manipulate the RC delay constant of the electronic oscillator. In some embodiments, the frequency control circuit 412 may also provide a second series of instructions to the memory unit 428. Based on the second series of instructions, the memory unit 428 provides individual signals $S_{fine,1}$, $S_{fine,2}$, $S_{fine,N}$ to selectively toggle the states of each resistor switch $426_1$, $426_2$, $426_N$. By selectively toggling the resistor switches, the effective resistance of the resistor network 404 may be altered.

After the frequency control circuit 412 provides a series of instructions to the memory unit 428, the frequency analysis circuit 418 will determine a second frequency and determine if the second frequency is within the range of the expected frequency. If the second frequency is not within the range of the expected frequency, the frequency control circuit 412 will again selectively provide a series of instructions to the memory unit 428 to vary the resistance/capacitance ratio of the electronic oscillator. In some embodiments, thermometric decoding may be applied to the series of instructions. If the second frequency is within the range of the expected frequency, the frequency control circuit 412 will take appropriate action to fix the states of the respective resistor switches $426_1$, $426_2$, $426_N$ and/or logic gates $424_1$, $424_2$, $424_N$.

Figure 5:
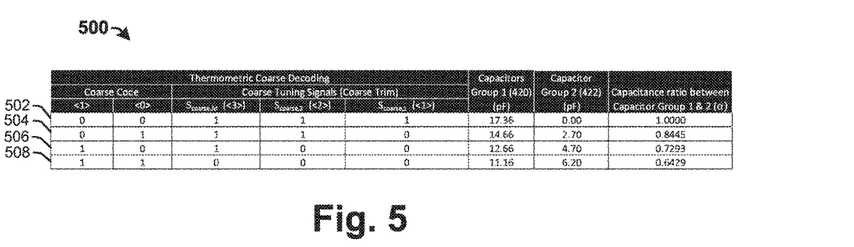
FIG. 5 illustrates a table of some embodiments of thermometric decoding being applied to a first string of bits to alter a capacitance ratio between a first group of capacitors and a second group of capacitors of an electronic oscillator.

FIG. 5 is a table 500 of some embodiments of thermometric decoding being applied to a first string of bits to alter a capacitance ratio between a first group of capacitors and a second group of capacitors of an electronic oscillator. The table 500 depicts a 2-bit thermometric coding example with 4 separate coarse codes 502, 504, 506, 508 that may be provided to the memory unit 428. In some embodiments, the number of bits used for the coarse codes may vary depending on the required frequency adjustment granularity, for example, 2-bit, 4-bit, 8-bit, 16-bit, 32-bit, etc. The coarse code is decoded by a thermometric decoder (not depicted) to output respective signals $S_{coarse,1}$, $S_{coarse,2}$, $S_{coarse,N}$ that define the state of each individual logic gate $424_1$, $424_2$, $424_N$. The coarse code may be decoded by a thermometric decoder to have a number of outputs based on the following equation:

$$\text{\# of outputs} = 2^M - 1 \quad \text{(eqn. 1.5)}$$

M refers to the number of bits provided to the thermometric decoder. For example, a 2-bit thermometric code provided to a thermometric decoder will generally output 3 signals (e.g., $S_{coarse,1}$, $S_{coarse,2}$, $S_{coarse,N}$). In some embodiments, varying the capacitance ratio between the first group of capacitors 420 and the second group of capacitors 422 allows for coarser modifications in the frequency output by the electronic oscillator than varying the effective resistance of the electronic oscillator.

The first coarse code 502 may be provided by the frequency control circuit 412 to the memory unit 428. In some embodiments, the memory unit may receive the first coarse code 502 and thermometric decoding may be applied prior to the logic gates $424_1$, $424_2$, $424_N$ receiving a respective signal $S_{coarse,1}$, $S_{coarse,2}$, $S_{coarse,N}$. In other embodiments, thermometric decoding may be applied to the first coarse code 502 prior to the memory unit 428 receiving the first coarse code 502. Based on the corresponding coarse code (e.g. 502), provided to the memory unit, the ratio between the first group of capacitors 420 and the second group of capacitors 422 can be altered. Accordingly, the frequency being generated by the electronic oscillator may be trimmed, for example, by increasing or decreasing the frequency being generated by the electronic oscillator. The second coarse code 504, the third coarse code 506, and the fourth coarse code 508 depict an example of altering the string of bits provided to the memory unit 428 by the frequency control circuit 412 to vary the capacitance ratio between the first group of capacitors 420 and second group of capacitor 422.

Figure 6:
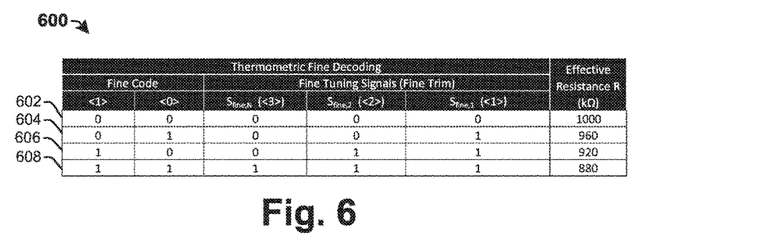
FIG. 6 illustrates a table of some embodiments of thermometric decoding being applied to a second string of bits to alter the effective resistance of an electronic oscillator.

FIG. 6 is a table 600 of some embodiments of thermometric decoding being applied to a second string of bits to alter the effective resistance of an electronic oscillator. The table 600 depicts 4 separate fine codes 602, 604, 606, 608 that may be provided to the memory unit 428. In some embodiments, the number of bits used for the fine codes may vary depending on the required frequency adjustment granularity, for example, 2-bit, 4-bit, 8-bit, 16-bit, 21-bit, etc. The fine code is decoded by a thermometric decoder (not depicted) to output respective signals $S_{fine,1}$, $S_{fine,2}$, $S_{fine,N}$ that define the state of each individual resistor switch $426_1$, $426_2$, $426_N$. The fine code may be decoded by a thermometric decoder to have a number of outputs based on (eqn. 1.5). In some embodiments, varying the effective resistance (R) of the resistor network 404 allows for finer modifications in the frequency output by the electronic oscillator than varying the capacitance ratio between the first capacitor group 420 and the second capacitor group 422.

The first fine code 602 may be provided by the frequency control circuit 412 to the memory unit 428. In some embodiments, thermometric decoding may be applied to the first fine code 602 prior to the memory unit 428 receiving the first fine code 602. In other embodiments, the memory unit may receive the first fine code 602 and thermometric decoding may be applied prior to the resistor switches $426_1$, $426_2$, $426_N$ receiving a respective signal $S_{fine,1}$, $S_{fine,2}$, $S_{fine,N}$. Based on the corresponding fine code (e.g. 602) provided to the memory unit, the effective resistance (R) of the resistor network 404 can be altered. Accordingly, the frequency being generated by the electronic oscillator may be trimmed, for example, by increasing or decreasing the frequency being generated by the electronic oscillator. The second fine code 604, the third fine code 606, and the fourth fine code 608 depict an example of altering the string of bits provided to the memory unit 428 by the frequency control circuit 412 to vary the effective resistance (R) of the resistor network 404.

Figure 7:
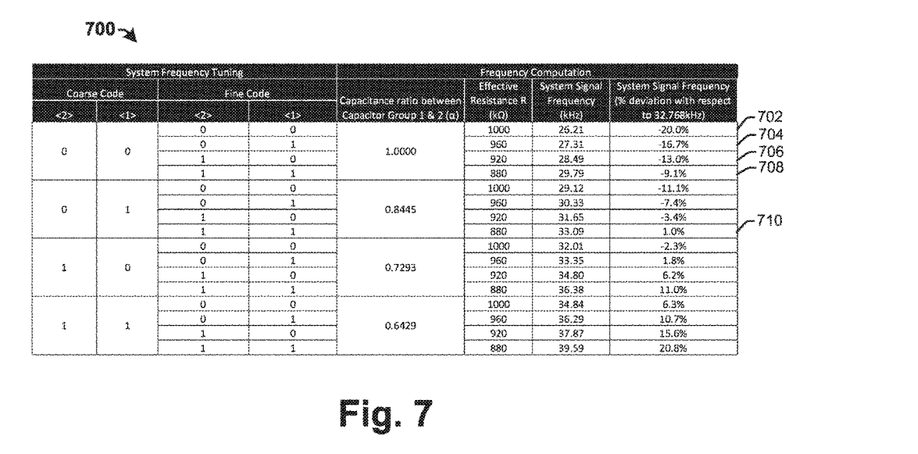
FIG. 7 illustrates a table of some embodiments of how the output frequency of the electronic oscillator is affected by the first string of bits of FIG. 5 and the second string of bits of FIG. 6 being applied to an electronic oscillator.

FIG. 7 is a table 700 showing some embodiments of how the output frequency of the electronic oscillator is affected by the first string of bits of FIG. 5 and the second string of bits of FIG. 6 being applied to an electronic oscillator. As illustrated, the table 700 depicts how the system signal frequency generated by the electronic oscillator is affected by varying the effective resistance (R) and the capacitance ratio between the first group of capacitors 420 and the second group of capacitors 422. A first system signal frequency 702 is generated by the electronic oscillator when the capacitance ratio between the first group of capacitors 420 and the second group of capacitors 422 is 1.0000 (eqn. 1.2) and the effective resistance of the resistor network is 1000 kΩ. A second system signal frequency 704, a third system signal frequency 706, and a fourth system signal frequency 708 depict the change in frequency when the capacitance ratio between the first group of capacitors 420 and the second group of capacitors 422 stays constant, but the effective resistance of the resistor network 404 varies. A fifth system signal frequency 710 illustrates how the fourth system signal frequency 708 is altered by keeping the effective resistance (R) constant (e.g. 1000 kΩ), but decreasing the capacitance ratio between the first group of capacitors 420 and the second group of capacitors 422 from 1.0000 to 0.8445.

The values in table 700 are for illustrative purposes. The system may compose of any number of capacitors or resistors, which may have any difference in resistance/capacitance values, to alter the system signal frequency generated by the electronic oscillator.

Figure 8:
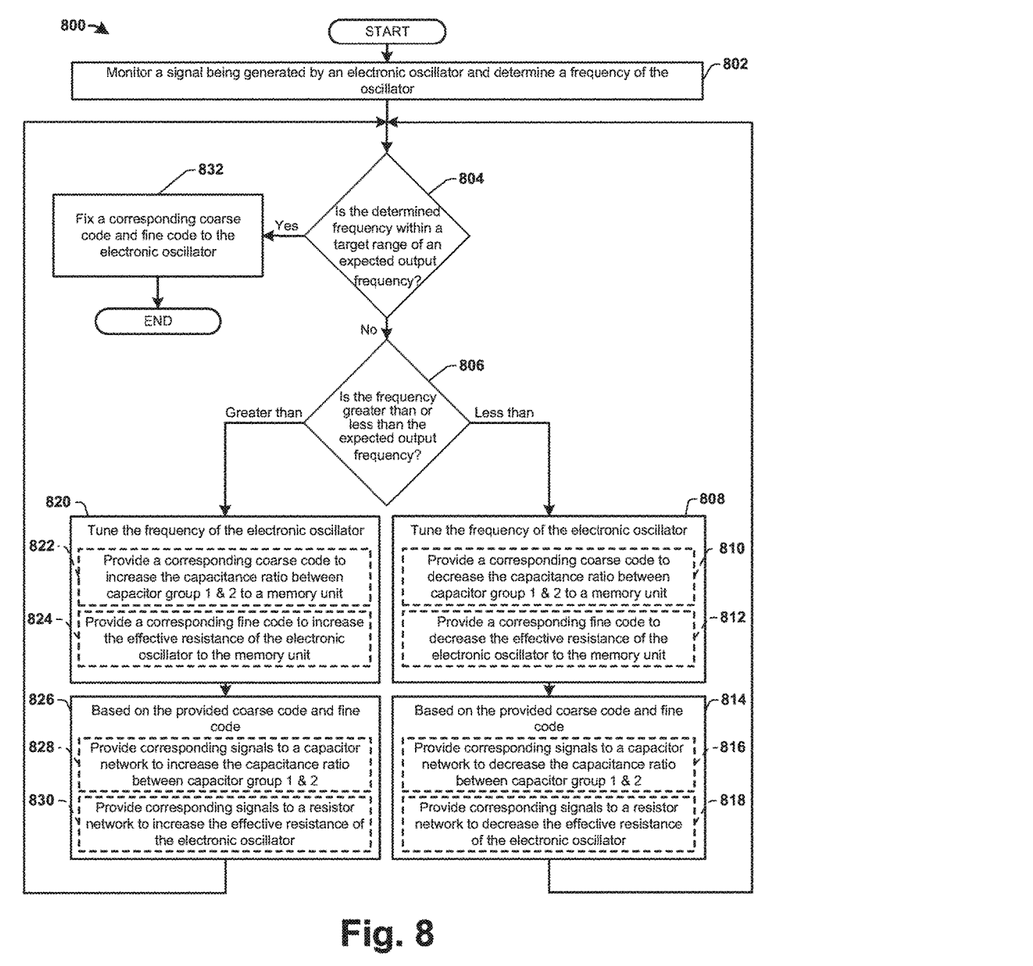
FIG. 8 illustrates a flow diagram of some embodiments of a method for selectively tuning the output frequency of an electronic oscillator.

FIG. 8 is a flow diagram of some embodiments of a method 800 for selectively tuning the output frequency of an electronic oscillator.

It will be appreciated that while method 800 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts or events may be required to implement one or more aspects or embodiments disclosure herein. Also, one or more of the acts depicted herein may be carried out in one or more separate acts and/or phases.

At 802, in some embodiments, a frequency testing circuit monitors a signal being generated by an electronic oscillator (e.g., a RC relaxation oscillator) and determines the frequency of the oscillator. The signal may be monitored at any node in the electronic oscillator, for example, a node connecting a resistor network and a capacitor network to a comparator.

At 804, in some embodiments, the frequency testing circuit may decide whether the determined frequency is within a target range of an expected output frequency. For example, the electronic oscillator may be generating a frequency of 39 kHz. However, the expected output frequency of the electronic oscillator is 32.768 kHz+/−5%. Therefore, a target range of the expected output frequency will range from approximately 31.1 kHz to 34.4 kHz. If the electronic oscillator was generating a frequency within the target range, the method would end by taking appropriate steps to fix the current frequency being output by the electronic oscillator (e.g., 832). If the determined frequency is not within the target range of the expected output, which is the case in the above example, the frequency generator will make another decision.

At, 806, the frequency testing circuit may decide whether the determined frequency is greater than or less than the expected output frequency. For example, the electronic oscillator may be generating a frequency of 39 kHz. However, the expected output frequency of the electronic oscillator is 32.768 kHz. Therefore, the frequency testing circuit will attempt to tune the electronic oscillator in a way to decrease the frequency of the oscillating signal that is being generated by the electronic oscillator. On the other hand, in some embodiments, if the electronic oscillator is generating a frequency that is greater than the expected output frequency, the frequency testing circuit will attempt to tune the electronic oscillator in a way to increase the frequency of the oscillating signal that is being generated by the electronic oscillator.

At 808, in some embodiments, the frequency testing circuit has determined that the determined frequency is less than the expected output frequency. Based on the previously determined frequency, the electronic oscillator will selectively tune the frequency of the electronic oscillator in an attempt to increase the frequency of the electronic oscillator.

In some embodiments, tuning the frequency of the oscillator comprises comparing the determined frequency of the oscillator with an expected frequency of the oscillator to determine a frequency offset, and subsequently tuning the oscillator by an amount based on the frequency offset.

At 810, in some embodiments, a corresponding coarse code that will decrease the capacitance ratio between a first group of capacitors and a second group of capacitors is provided to a memory unit, wherein the first group of capacitors and second group of capacitors corresponds to the first and second group of capacitors discussed above. In some embodiments, the coarse code is provided to the memory unit by the frequency testing circuit. In further embodiments, thermometric decoding may be applied before or after the coarse code is provided to the memory unit.

At 812, in some instances, a corresponding fine code that will decrease the effective resistance of the electronic oscillator may be provided to the memory unit. In some embodiments, the corresponding fine code is provided to the memory unit by the frequency testing circuit. In further embodiments, thermometric decoding may be applied to the fine code before or after it is provided to the memory unit.

At 814, in some instances, based on the corresponding coarse code and fine code provided to the memory unit, corresponding signals are provided to a capacitor network to decrease the capacitance ratio between the first group of capacitors and the second group of capacitors and to a resistor network to decrease the effective resistance of the resistor network.

At 816, in some instances, the memory unit may provide separate corresponding coarse signals to toggle logic gates disposed in the capacitor network between a first state, which connects a first plate of some capacitors to an inverter of the electronic oscillator, and a second state, which connects a first plate of some capacitors to ground. By increasing the number of capacitors of the capacitor network that have their first plate connected to the inverter of the electronic oscillator, the frequency being generated by electronic oscillator may be selectively decreased.

At 818, in some embodiments, the memory unit may provide separate corresponding fine signals to resistor switches disposed in the resistor network to increase or decrease the effective resistance of the resistor network. In some embodiments, each resistor in the resistor network has a respective resistor switch connected in parallel. Therefore, by toggling some resistor switches to effectively reduce the resistance of the resistor network (e.g. by toggling a switch to bypass a resistor in the resistor network), the frequency being generated by the electronic oscillator may be selectively increased.

At 820, in some embodiments, the frequency testing circuit has determined that the determined frequency is greater than the expected output frequency. Based on the previously determined frequency, the electronic oscillator will selectively tuned the frequency of the electronic oscillator in an attempt to decrease the frequency of the electronic oscillator by the previously calculated offset frequency. In some embodiments, the frequency testing circuit attempts to tune the frequency of the oscillator by an amount based on a previously calculated frequency offset.

At 822, in some embodiments, a corresponding coarse code that may increase the capacitance ratio between a first group of capacitors and a second group of capacitors is provided to a memory unit, wherein the first group of capacitors and second group of capacitors corresponds to the first and second group of capacitors discussed above. In some embodiments, the coarse code is provided to the memory unit by the frequency testing circuit. In further embodiments, thermometric decoding may be applied before or after the coarse code is provided to the memory unit.

At 824, in some instances, a corresponding fine code that will increase the effective resistance of the electronic oscillator may be provided to the memory unit. In some embodiments, the corresponding fine code is provided to the memory unit by the frequency testing circuit. In further embodiments, thermometric decoding may be applied to the fine code before or after it is provided to the memory unit.

At 826, in some instances, based on the corresponding coarse code and fine code provided to the memory unit, corresponding signals are provided to the capacitor network to increase the capacitance ratio between the first group of capacitors and the second group of capacitors and to a resistor network to increase the effective resistance of the resistor network.

At 828, in some instances, the memory unit may provide separate corresponding coarse signals to toggle logic gates disposed in the capacitor network between a first state, which connects a first plate of some capacitors to an inverter of the electronic oscillator, and a second state, which connects a first plate of some capacitors to ground. By increasing the number of capacitors of the capacitor network that have their first plate connected to ground, the frequency being generated by the electronic oscillator may be selectively decreased.

At 830, in some embodiments, the memory unit may provide corresponding fine signals to resistor switches to increase or decrease the effective resistance of the resistor network. In some embodiments, each resistor in the resistor network has a respective resistor switch connected in parallel. Therefore, by toggling some resistor switches to effectively reduce the resistance of the resistor network (e.g. by toggling a switch to cause current to pass through a resistor), the frequency being generated by electronic oscillator may be selectively decreased.

In some embodiments, one or more of acts 804-830 may be iteratively performed to until a determined frequency is within a target range of an expected output frequency (shown by arrows extending from acts 814 and/or 826 to act 804).

At, 832, in some embodiments, once the electronic oscillator is generating a frequency within the target range, the method will end by taking appropriate steps to fix the corresponding coarse code and fine code to the electronic oscillator, for example, by programming the coarse code and fine code to read only memory. If a determined frequency is not within the target range of the expected output, which is the case in the above example, the frequency generator will make another decision and follow the above mentioned steps until the electronic oscillator is generating a frequency within the target range.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A frequency generator, comprising:
a comparator configured to output an oscillating voltage signal having a first frequency;
a RC network circuit coupled between an input and an output of the comparator, wherein the RC network circuit comprises:
a resistor network;
a capacitor network comprising a plurality of capacitors, wherein each capacitor of the plurality of capacitors comprises a first plate and a second plate, and wherein the second plates of the plurality of capacitors are coupled together; and
a frequency testing circuit configured to determine whether the first frequency is within an expected frequency range, wherein the frequency testing circuit is configured to selectively connect the first plate of some of the capacitors disposed in the capacitor network to a non-varying voltage and other capacitors disposed in the capacitor network to an input of the capacitor network when the first frequency is outside of the expected frequency range;
a first logic gate having a first input coupled to the frequency testing circuit, a second input coupled to an output of the comparator, and an output coupled to a first one of the plurality of capacitors; and
a second logic gate having a first input coupled to the frequency testing circuit, a second input coupled to the output of the comparator, and an output coupled to a second one of the plurality of capacitors and not to the first one of the plurality of capacitors.

2. The frequency generator of claim 1, wherein the resistor network comprises a plurality of resistors connected in series.

3. The frequency generator of claim 2,
wherein the resistor network further comprises a plurality of resistor switches connected in parallel with a respective resistor of the plurality of resistors; and
wherein the frequency testing circuit is configured to toggle the resistor switches to selectively vary the resistance of the resistor network when the first frequency is outside the expected frequency range.

4. The frequency generator of claim 3, wherein the frequency testing circuit is configured to change a capacitance of the RC network circuit when the first frequency is outside of the expected frequency range.

5. An electronic oscillator, comprising:
a comparator connected to a first node and a third node;
a resistor network disposed between the first node and the third node;
an inverter connected to the first node and a second node;
a plurality of capacitors respectively comprising a first plate and a second plate connected to the third node;
a plurality of logic gates respectively comprising a first input connected to the second node, a second input, and an output connected to the first plate of one of the plurality of capacitors; and
a memory unit connected to the second input of the plurality of logic gates, wherein the memory unit is configured to output a separate signal to the second input of the plurality of logic gates, wherein the separate signal determines whether the first plate of one of the plurality of capacitors is connected to the second node or a non-varying voltage.

6. The electronic oscillator of claim 5, wherein the plurality of capacitors comprise:
a first group of capacitors, wherein the first plate of each capacitor of the first group of capacitors is connected to the second node; and
a second group of capacitors comprising at least one of the plurality of capacitors, wherein the first plate of each capacitor of the second group of capacitors is connected to the non-varying voltage.

7. The electronic oscillator of claim 6, wherein the resistor network comprises a plurality of resistors connected in series.

8. The electronic oscillator of claim 7, further comprising:
a plurality of resistor switches, wherein the resistor switches are connected in parallel with a respective resistor of the plurality of resistors, wherein some of the resistor switches are connected to the first node.

9. The electronic oscillator of claim 6, wherein the memory unit provides a first signal to each of the plurality of logic gates coupled to the second group of capacitors.

10. The electronic oscillator of claim 6, wherein the memory unit is configured to output a first set of signals for a first period of time and output a second set of signals for a second period of time, wherein the first set of signals is different than the second set of signals.

11. The electronic oscillator of claim 10, further comprising:
a level shifter connected to the first node, wherein the level shifter is configured to receive an input signal from the comparator, shift a voltage of the input signal, and output the voltage shifted input signal to an output node of the electronic oscillator.

12. The electronic oscillator of claim 11, wherein the memory unit is read only memory (ROM).

13. The electronic oscillator of claim 5, wherein the memory unit is configured to selectively change a voltage potential at the first plate of the plurality of capacitors between the non-varying voltage and a voltage potential at the second node.

14. A method for tuning an output frequency of an electronic oscillator, comprising:
determining whether a first frequency of an electronic oscillator is within a range of an expected output frequency, wherein the electronic oscillator comprises a comparator connected to a RC network circuit comprising a capacitor network and a resistor network;
upon determining the first frequency is not within the range of the expected output frequency, adjusting the first frequency of the electronic oscillator by selectively tuning a capacitance ratio of a first number of a plurality of capacitors within the capacitor network and a second number of the plurality of capacitors, wherein the first number of the plurality of capacitors respectively have a first plate connected to an output of an inverter coupled to the comparator, and wherein a second number of the plurality of capacitors respectively have a first plate connected to a non-varying voltage;

after selectively tuning the capacitance ratio, determining whether a second frequency is within the range of the expected output frequency; and upon determining the second frequency is within the range of the expected output frequency, fixing the capacitance ratio between the first number of the plurality of capacitors and the second number of the plurality of capacitors.

15. The method of claim 14, wherein selectively tuning the capacitance ratio between the first number of the plurality of capacitors and the second number of the plurality of capacitors comprises:

providing separate signals to separate ones of a plurality of logic gates, wherein outputs of the plurality of logic gates are respectively connected to the first plate of a plurality of capacitors, and inputs of the plurality of logic gates are respectively connected to the output of the inverter.

16. The method of claim 14, wherein selectively tuning the capacitance ratio between the first number of the plurality of capacitors and the second number of the plurality of capacitors comprises:

toggling a switch connected to the first plate of the plurality of capacitors, wherein the switch is toggled between the non-varying voltage and the output of the inverter.

17. The method of claim 15, calculating a first offset frequency based on a difference between the first frequency and the expected output frequency of the electronic oscillator; and wherein a frequency testing circuit determines the first frequency and the first offset frequency, wherein the frequency testing circuit selectively provides a string of bits to a memory unit based on the first frequency and the first offset frequency, wherein the memory unit provides a set of signals to the electronic oscillator based on the string of bits received from the frequency testing circuit.

18. The method of claim 17, wherein fixing the capacitance ratio between the first number of the plurality of capacitors and the second number of the plurality of capacitors comprises the frequency testing circuit writing the string of bits to the memory unit.

19. The method of claim 18, further comprising:

upon determining the first frequency is not within the range of the expected output frequency, based on the first offset frequency, selectively tuning a resistance of the electronic oscillator; and upon determining the second frequency is within the range of the expected output frequency, fixing the resistance of the electronic oscillator.

20. The frequency generator of claim 1, wherein:

the first logic gate is configured to switch between outputting a first electric potential and outputting a second electric potential different than the first electric potential; and the second logic gate is configured to switch between outputting the first electric potential and the second electric potential.

* * * * *